(12) United States Patent
Abe et al.

(10) Patent No.: US 7,497,755 B2
(45) Date of Patent: Mar. 3, 2009

(54) APPARATUS FOR TESTING ELECTROLUMINESCENT DISPLAY

(75) Inventors: Hisashi Abe, Osaka (JP); Derek Luke, Brampton (CA)

(73) Assignees: Ifire IP Corporation, Toronto, Ontario (CA); Sanyo Electric Co., Ltd., Osaka (JP)

( * ) Notice: Subject to any disclaimer, the term of this patent is extended or adjusted under 35 U.S.C. 154(b) by 330 days.

(21) Appl. No.: 10/952,642

(22) Filed: Sep. 29, 2004

(65) Prior Publication Data

US 2005/0073250 A1 Apr. 7, 2005

Related U.S. Application Data

(60) Provisional application No. 60/508,602, filed on Oct. 3, 2003.

(51) Int. Cl.
*H01J 9/42* (2006.01)
(52) U.S. Cl. .......................................... 445/63; 313/505
(58) Field of Classification Search .................. 313/505; 174/250, 254–255, 260–261; 445/63; 356/121–123
See application file for complete search history.

(56) References Cited

U.S. PATENT DOCUMENTS

| | | | |
|---|---|---|---|
| 5,309,316 A * | 5/1994 | Yagi et al. ................... 361/749 |
| 5,432,015 A | 7/1995 | Wu et al. | |
| 5,608,558 A | 3/1997 | Katsumi | |
| 6,028,442 A | 2/2000 | Lee et al. | |
| 6,111,424 A | 8/2000 | Bosacchi | |
| 6,566,902 B2 | 5/2003 | Kwon et al. | |
| 2001/0019243 A1 | 9/2001 | Hidler | |
| 2002/0063574 A1 | 5/2002 | Cheng et al. | |
| 2003/0117165 A1 | 6/2003 | Kim | |
| 2003/0137318 A1 | 7/2003 | Enachescu et al. | |

FOREIGN PATENT DOCUMENTS

| | | |
|---|---|---|
| JP | 08-050297 | 2/1996 |
| JP | 2000-155302 | 6/2000 |
| WO | WO 00/70917 | 11/2000 |
| WO | WO 03/055636 A1 | 7/2003 |
| WO | WO 03/056879 A1 | 7/2003 |
| WO | WO 2004/027868 A2 | 4/2004 |

\* cited by examiner

*Primary Examiner*—Toan Ton
*Assistant Examiner*—Hana A Sanei
(74) *Attorney, Agent, or Firm*—Fay Sharpe LLP

(57) ABSTRACT

An apparatus for improving testability of electroluminescent displays (ELDs) comprises at least two sets of electrodes, one set for connecting rows of pixels, and a second set for connecting columns of pixels, wherein at least one electrode set is interleaved in two subsets. The first subset has electrode extensions of a first length, and the second subset has electrode extensions of a second, shorter, length. A first connector is disposed generally in a direction perpendicular to the electrode extensions of both subsets and in electrical contact with the electrode extensions of the second subset. A second connector is disposed generally in a direction perpendicular to the electrode extensions of the first subset, and in electrical contact with the electrode extensions of only the first subset. A set of insulating patches separate the electrode extensions of the first subset from the first connector.

29 Claims, 4 Drawing Sheets

APPARATUS FOR TESTING ELECTROLUMINESCENT DISPLAY

This application claims priority from U.S. Provisional Application Ser. No. 60/508,602, filed on Oct. 3, 2003.

FIELD OF THE INVENTION

The present invention relates to electrode design for electroluminescent displays (ELDs), or more particularly to an electrode design improved for testability purposes.

BACKGROUND OF THE INVENTION

Electroluminescent displays (ELDs) are advantageous by virtue of their low operating voltage with respect to cathode ray tubes, their superior image quality, wide viewing angle- and fast response time over liquid crystal displays, and their superior gray scale capability and thinner profile than plasma display panels.

An ELD has two intersecting sets of parallel electrically conductive address lines called rows and columns that are disposed on either side of a phosphor film encapsulated between two dielectric films. A pixel is defined as the intersection point between a row and a column. Each pixel is illuminated by the application of a voltage across the intersection of row and column.

Video-capable ELDs comprise a pixel array driven using passive matrix addressing. Each pixel includes of three sub-pixels to generate red, green and blue light for full colour. Each of the sub-pixels comprises a portion of the aforementioned thin phosphor film, disposed between the two insulator films that, in turn, are disposed between row and column address lines. Matrix addressing entails applying a voltage below the threshold voltage to a row while simultaneously applying a modulation voltage of the opposite polarity to each column that bisects that row in two. The voltages on the row and the column are summed to give a total voltage in accordance with the illumination desired on the respective sub-pixels, thereby generating one line of the image. An alternate scheme is to apply the maximum sub-pixel voltage to the row and apply a modulation voltage of the same polarity to the columns. The magnitude of the modulation voltage is up to the difference between the maximum voltage and the threshold voltage to set the pixel voltages in accordance with the desired image. In either case, once each row is addressed, another row is addressed in a similar manner until all of the rows have been addressed. Rows which are not addressed are left at open circuit.

The sequential addressing of all rows constitutes a complete frame. Typically a new frame is addressed at least about 50 times per second to generate what appears to the human eye a flicker-free video image.

ELDs may be constructed on a substrate by sequential deposition and patterning of a first parallel electrode array, an insulating layer, a luminescent layer, a second insulating layer and a second parallel electrode array substantially orthogonal to the first parallel electrode array. The layers of the display may be deposited and patterned using thick film techniques or thin film techniques. The displays are operated using passive matrix addressing, as described above.

Thick film dielectric ELDs have been found to have particular utility for high-resolution video-capable large area displays in television and other applications. These are constructed on ceramic, glass or glass ceramic substrates as exemplified by U.S. Pat. No. 5,432,015, PCT Patent Application CA00/00561 and PCT Patent Application CA02/01932. In particular, the first array of electrodes can be deposited on the substrate and patterned using vacuum deposition or by printing and sintering of thick film pastes containing electrically conductive powders. Typically, gold is used as the electrically conductive material for the first parallel array of electrodes, but other conductive metals, alloys, or electrically conductive materials may be used as well, provided that they are compatible with the rest of the display structure.

The second array of electrodes is typically indium tin oxide (ITO), which is optically transparent as well as electrically conductive to allow light generated within the display to be transmitted to the display viewer. The ITO is typically vacuum deposited on the display structure and patterned into parallel lines using photolithographic or laser patterning methods, as exemplified in PCT Patent Application CA02/01891. The ends of these indium tin oxide address lines overlap with and extend beyond the active area of the display to contact pads using gold as the electrical conductor.

Display drivers are provided that function as switches to supply the required voltage pulses to the rows and columns. These drivers are packaged as multiple output chips that can drive several rows or columns and are typically mounted on a separate circuit board. The outputs from the driver chips are connected to the rows and columns using flex-tape connectors comprising parallel electrical conductors embedded in a plastic tape. The conductors in the tape are aligned with conductor pads connected to the rows and columns on the display panel and also with the outputs from the driver chips on the circuit board. Electrical connections are formed by hot pressing the tape onto the respective conductor pads. However, in the manufacturing process it is desirable to electrically test the panel before making these connections so that defective panels can be discarded or repaired before the valuable circuit boards are attached to them.

Prior art method electrical testing of ELD panels includes identifying and locating short circuits ("shorts") between adjacent rows and columns on the panel; identifying and locating electrical discontinuities ("opens") along rows and columns; measuring the white luminance uniformity of the panel; and independently measuring the red, green and blue sub-pixel set uniformity.

The test methods of the prior art sometimes cause electrical breakdown between adjacent rows or between adjacent columns during the test procedure. This is due to the generation of large voltages between the rows or columns caused by sudden changes in the current passing through these components if the contacts made using the elastomeric strips are intermittent. The large voltages generated by these current changes may be characterized by the fundamental relationship $V=L\, di/dt$, where V is the induced voltage, $di/dt$ is the rate of current change with time and L is the electrical inductance of the panel and associated electrical connections for the test. For an intermittent connection, the rate of current change is typically very high, resulting in a high induced voltage.

Accordingly, there is a need in the art for an improved method of conducting electrical testing of an ELD constructed on a substrate. Ideally, the method should provide improved testing reliability and avoid inadvertent damage to the display during testing due to intermittent electrical contacts.

The prior art has attempted to address this need, as follows:

Published U.S. 2003/137318 and U.S. 2003/0117165 both teach the use of shorting bars for testing, but these are not formed as part of the panel manufacturing process and so do not provide reliable connections.

Published U.S. 2002/0063574 discloses shorting bars formed during fabrication of an LCD display, that are later trimmed off. However, all rows or columns are not tested together, and a large number of probes are required for the test.

U.S. Pat. No. 6,566,902 teaches parallel connection of data lines (i.e. columns) for an LCD display, but there is no requirement to disconnect the parallel connection following testing.

U.S. Pat. No. 6,111,424 discloses shorting bars fabricated on the panel during manufacture that are disconnected following testing of an active matrix LCD panel, with defect analysis performed by infrared imaging.

U.S. Pat. No. 6,028,442 arranges LCD data lines into a number of blocks using parallel connections controlled by thin film transistors.

U.S. Pat. No. 5,608,558 discloses shorting bars as part of a defect testing apparatus for active matrix LCD displays, which must be connected with a large number of connections to the panel.

All of the foregoing prior art relates to testing of LCD panels, mostly active matrix LCD panels, where the principle of operation is different from EL displays, and the detection method for shorts and opens is also different.

U.S. 2001/0019243 relates to EL displays, but does not address the need in the art for an improved method of conducting electrical testing of an ELD.

SUMMARY OF THE INVENTION

In an aspect of the invention, there is provided an ELD having improved testability, comprising a substrate, a matrix of pixels arranged in rows and columns and formed on the substrate. At least two sets of electrodes are provided, and one set for connecting rows of pixels, and a second set for connecting columns of pixels, wherein at least one electrode set is interleaved in two subsets. The first subset has electrode extensions of a first length, and the second subset has electrode extensions of a second, shorter, length. A first connector is provided, generally extending in a direction perpendicular to the electrode extensions of the subsets, and in electrical contact with the electrode extensions of the second subset. A second connector is provided, generally in a direction perpendicular to the electrode extensions of the first subset, and in electrical contact with the electrode extensions of the first subset, but not in electrical contact with the electrode extensions of the second subset. A set of insulating patches is provided for electrically separating the electrode extensions of the first subset from the first connector.

According to another aspect of the invention, there is provided a substrate and a matrix of pixels arranged in rows and columns, formed on the substrate. At least two sets of electrodes are provided, one set for connecting rows of pixels, and a second set for connecting columns of pixels, wherein at least one electrode set is interleaved in three subsets, the first subset having electrode extensions of a first length, and the second subset having electrode extensions of a second, shorter, length, and the third subset having electrode extensions of a third length, shorter than the first or second length. A first connector is provided, generally extending in a direction perpendicular to the electrode extensions of the subsets, and in electrical contact with the electrode extensions of the third subset. A second connector is provided, generally extending in a direction perpendicular to the electrode extensions of the first and second subsets, in electrical contact with the electrode extensions of the first and second subsets, but not in electrical contact with the electrode extensions of the third subset. A third connector is provided, generally extending in a direction perpendicular to the electrode extensions of the first subset, in electrical contact with the electrode extensions of he first subset, but not in electrical contact with the electrode extensions of the second and third subsets. A first set of insulating patches electrically separates the electrode extensions of the first and second subsets from the first connector, and a second set of insulating patches separates the electrode extensions of the first subset from the second connector.

In an another aspect of the invention, there is provided a Color ELD having improved testability comprising a substrate and a matrix of pixels, arranged in rows and columns, formed on the substrate. At least two sets of electrodes are provided, one set for connecting rows of pixels, and a second set for connecting columns of pixels. At least one electrode set is interleaved in two subsets, the first subset having a first set of electrode extensions, and the second subset having a second set of electrode extensions. The first and second set of electrode extensions extends from opposite ends of the corresponding electrode set. A first connector is provided, generally extending in a direction perpendicular to, and in electrical contact with the first set of electrode extensions, and a second connector is provided, generally extending in a direction perpendicular to, and in electrical contact with the second set of electrode extensions.

BRIEF DESCRIPTION OF THE DRAWINGS

A preferred embodiment of the present invention is described, by way of example only, with reference to the attached Figures, wherein.

DETAILED DESCRIPTION OF THE INVENTION

Figure 1:
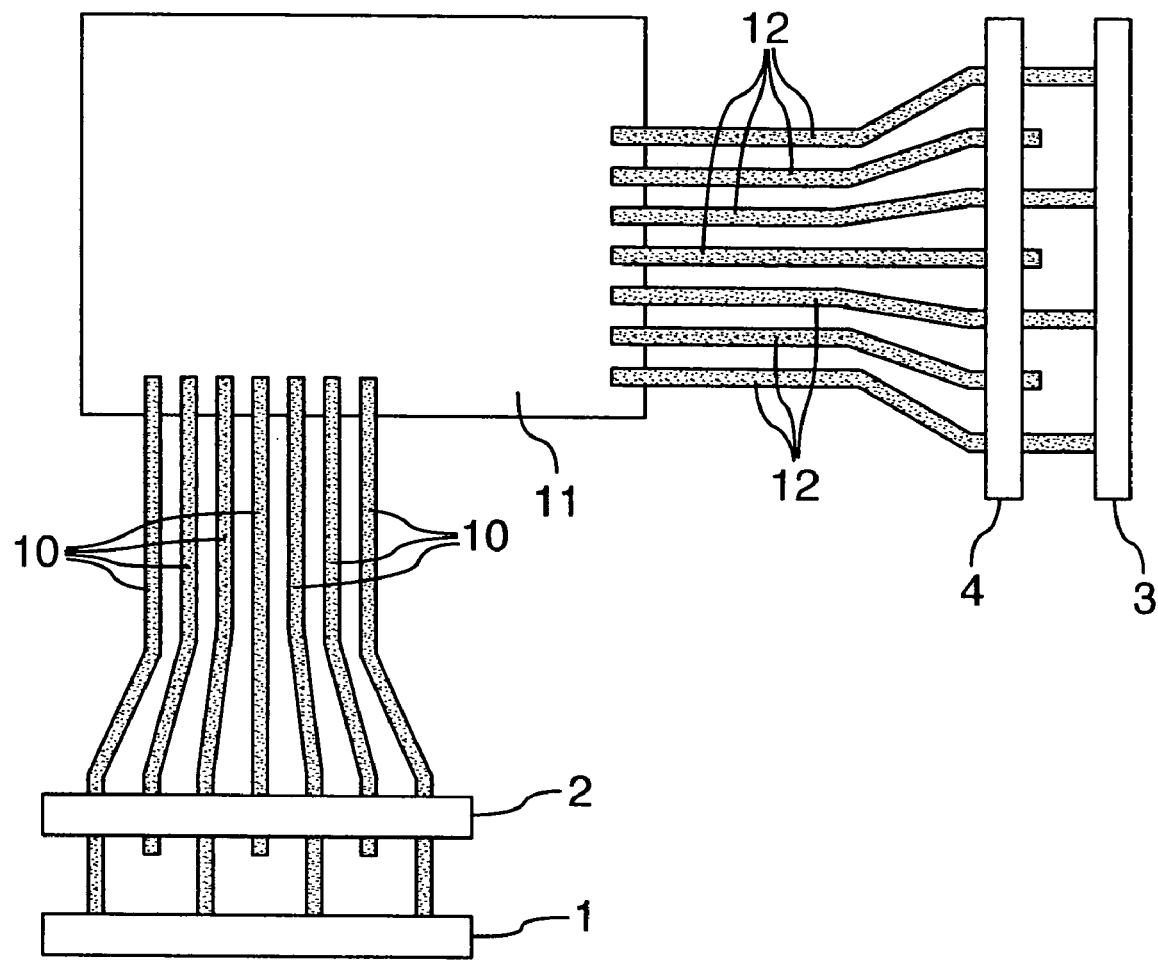
FIG. 1 shows a plan view of a prior art ELD.

With reference to FIG. 1, there is shown a prior art ELD wherein testing for shorts between columns entails connecting one end of a set of alternating columns 10 extending from the active area of a display 11 in parallel to one terminal of a power supply (not shown). This is accomplished by compressing a rectangular strip of elastomeric electrically conductive polymer 1 using a platen connected to the power supply terminal (not shown) and connecting a set of adjacent rows 12 in parallel to the other terminal of the power supply using an elastomeric strip 4. A voltage sufficient to illuminate the panel is then applied across the power supply terminals. If the display substrate is not perfectly flat, the elastomeric conductor material may not reliably contact all of the columns and the probability of a weak contact therefore increases. For this reason, only a few columns at a time are connected, and the elastomeric conductor material is progressively moved along the columns and successive measurements are made to check all columns for shorts. Alignment of the contacts with the proper columns is checked prior to each measurement.

If no shorts are present, only the alternating columns that are connected will illuminate. If a column between these columns illuminates, there is a short to one or both adjacent columns. To determine whether the short is to the column to the right or to the left of the column in question, an electrical continuity check is made between that column and each of the right and left columns. To locate the short along the length of the columns, a visual examination under a microscope is used.

A similar procedure is used to check for shorts between rows. Again with reference to FIG. 1, the test for row shorts entails connecting a set of alternating rows 12 to one terminal of the power supply using the elastomeric strip 3 and a set of adjacent columns to the other terminal of the power supply using the elastomeric strip 2. The elastomeric strip 3 is progressively moved along the rows to test all of the rows.

Again with reference to FIG. 1, the test for column opens entails connecting one terminal of a power supply via an elastomeric strip 2 to a set of adjacent columns and the other terminal via an elastomeric strip 4 to a set of adjacent rows. A voltage sufficient to illuminate the pixels where the rows and columns intersect is applied between the terminals. If no opens are present, all pixels should illuminate. If an open exists in a column in the illuminated portion of the panel, that column will not be illuminated beyond the open. The position of the open is marked by the discontinuity in the column illumination. While each set of columns is connected, the elastomeric strip is moved progressively to different sets of rows so that opens along the entire length of the columns can be located. If no portion of a column illuminates, it means the open is in the connector between the contact point with the elastomeric strip and the beginning of the column. In this case the location of the open is determined by microscopic examination. Once each set of columns is scanned, the elastomeric strip 2 is progressively moved and the process repeated.

The rows are checked for opens in the same manner that the columns are checked, using the same pair of elastomeric strips 2 and 4 as shown in FIG. 1.

The white luminosity of panels is checked in a manner similar to open testing, but in this case the luminance and CIE colour coordinate of the illuminated areas is measured.

It is also desirable to test the colour purity of the individual sets of red, green and blue sub-pixels. For this test, special connectors are employed that line up with every third column since the sub-pixel sets are defined by columns. A precision alignment tool is used to move the connector progressively along the columns. The CIE colour coordinates and luminance are measured as per the white luminosity measurement.

Figure 2:
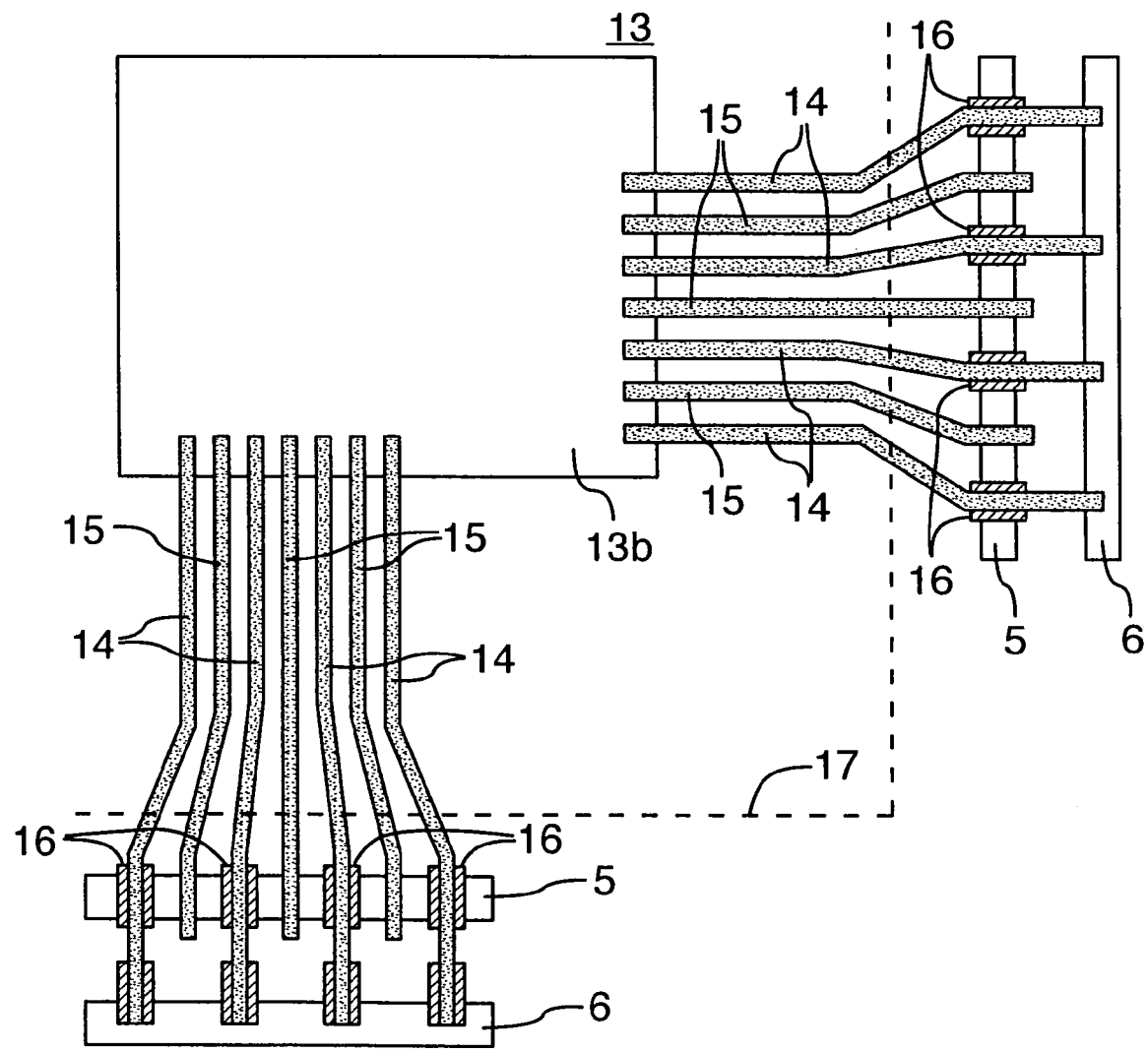
FIG. 2 shows a plan view of an ELD according to the invention.

With reference to FIG. 2, a row and/or column electrode design for an ELD 13 is shown, according to one embodiment of the invention. Electrically conductive electrode extension strips are provided for a first set 14 and a second set 15 of alternating and interleaved electrodes of the display These extensions 14 and 15 extend outward from the active portion 13b of the display 13.

The first set of electrode extensions 14 extend further out than the second set of electrode extensions 15. A portion of the first set of electrode extensions 14 each cover or are covered by an electrically insulating patch 16. The electrically insulating patches 16 are aligned in a direction substantially perpendicular to the electrode extension strips of the first set of electrodes 14. A first electrically conductive connecting strip 5 is aligned substantially perpendicular to the first set of electrode extensions 14, and on the side of the insulating patches 16 opposite the electrode extensions. The strip 5 is in electrical contact with all of the second set of alternating electrodes 15 and not in electrical contact with the first set of alternating electrodes 14. A second electrically conductive connecting strip 6 is aligned substantially perpendicular to the electrode extensions 14 and 15 and beyond the extent of the second set of electrode extensions 15. The strip 6 is in electrical contact with the first set of electrode extensions 14 and not in electrical contact with the second set of electrode extensions 15.

Following electrical testing of the ELD panel, a disconnection may be made along the dotted line 17, to electrically isolate the electrodes from the first and second electrically conductive connecting strips 5 and 6. Dotted line 17 is selected to preserve a length of the extensions to which permanent drivers for the electrodes can be connected.

The test protocol for checking shorts between columns according to the present invention is to connect one terminal of a power supply across the first or second electrically conductive connective strips 5 or 6 for the columns. The other power terminal is simultaneously connected to both electrically conductive connective strips 5 and 6 for the rows. A voltage is then applied sufficient to light the panel. If there are-no shorts, only alternating columns will illuminate. If there is a short, two adjacent columns will light. If a column has a short to an adjacent column, it can be determined if the short is to the column to the right or to the column to the left by changing the column connection to the other set of columns. Although only a portion of the columns or rows needs to be checked for shorts at one time, it is advantageous to check all columns at the same time. This is made possible by eliminating the elastomeric connections employed in the prior art method where only a limited number of rows or columns can be checked simultaneously due to roughness or irregularities in the display substrate surface.

The test protocol for checking shorts between rows using the present invention is to interchange row and column connections and proceed as discussed above in connection with checking column shorts.

The test protocol for checking opens in columns or rows according to the present invention is to connect one terminal of a power supply simultaneously to both electrically conductive connecting strips 5 and 6 for the row electrodes. The other power supply terminal is connected simultaneously to both electrically conductive connecting strips 5 and 6 for the columns. Opens can be located by the position of any discontinuity between lit and unlit portions of the rows and columns, or if an entire row or column is unlit, the row or column extension may be examined under a microscope for an open circuit.

The white CIE colour coordinate and luminance uniformity can also be tested using the connection scheme of the present invention, for row or column opens.

The CIE colour coordinates and luminosity uniformity of red, green and blue sub-pixel sets cannot be separately tested using the embodiment of FIG. 2. If separate red, green and blue sub-pixel uniformity measurements are desired, the alternative embodiment of FIG. 3 may be used, which employs a somewhat more complex electrode design, but the short and open tests can be done in a similar manner as in FIG. 2.

Figure 3:
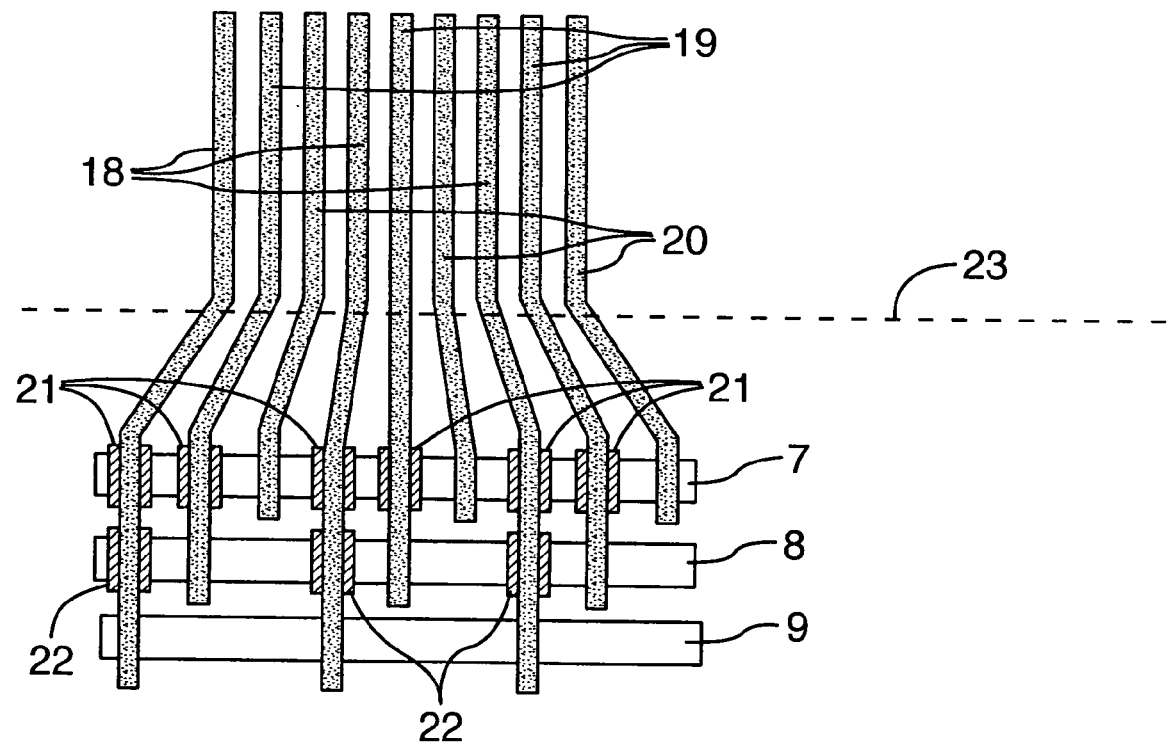
FIG. 3 shows a partial plan view of a colour ELD according to a first alternative embodiment of the invention, detailing the electrode extensions and connectors.

With reference to FIG. 3, the row electrode design is as per the first embodiment of FIG. 2. However, the column electrode design comprises electrically conductive strips for three sets of interleaved column electrodes of the display that respectively define the red, green and blue sub-pixel elements for the display. Each electrode in the three sets overlaps with or is electrically connected to electrically conductive electrode extensions 18, 19 and 20 that extend outward for a distance from the active portion of the display. The first set of electrode extensions 18 extend further out than the second and third sets of electrode extensions 19 and 20 respectively. The second set of electrode extensions 19 extend further out than the third set of electrode extensions 20.

The electrode extensions 18 and 19 for the first and second sets of electrodes each cover or are covered by a first set of insulating patches 21. The electrode extensions 18 for the first set of electrodes each cover or are covered by a second set of insulating patches 22. Those patches 21 and 22, associated with said first set of electrodes 18, may be conjoined. The first and second sets of insulating patches 21 and 22 are each aligned in a direction substantially perpendicular to the electrode extension strips 18,19 and 20.

A first electrically conductive connecting strip 7 is aligned substantially perpendicular to the electrode extension strips 18, 19, and 20 on the side of the first set of insulating patches 21 opposite the electrode extensions 18, 19 and 20. The strip 7 is therefore in electrical contact with the third set of electrode extensions 20 but not in electrical contact with said the first and second sets of electrode extensions 18 and 19. A second electrically conductive connecting strip 8 is aligned substantially perpendicular to the electrode extension strips 18 and 19 on the side of said second set of insulating patches 22 opposite the first and second set of electrode extensions 18 and 19. The strip 8 is in electrical contact with the second set of electrode extensions 19 but not in electrical contact with the first or third set of electrode extensions 18 or 20. A third electrically conductive connecting strip 9 is aligned substantially perpendicular to the first set electrode extension strips 18 and in electrical contact with the first set of electrode extensions 18 but not in electrical contact with the second or third set of electrode extensions 19 or 20.

Following electrical testing of the ELD panel, a cut 23 is formed in the electrically conductive extensions, for example by laser cutting. This process is performed to electrically disconnect the extensions from the first, second and third connecting electrically conductive connecting strips 7,8, and 9 while preserving a length of the extensions to which permanent drivers for the electrodes can be later connected.

Short testing and open testing can also be performed. The test protocol for checking shorts between columns using the embodiment of FIG. 3 is to connect one terminal of a power supply across the first, second or third electrically conductive connective strips 7, 8, or 9 for the columns. The other power supply terminal is connected simultaneously to both electrically conductive connective strips 5 and 6 for the rows. A voltage sufficient to light the panel is then applied. If there are no shorts, only every third column will illuminate. If there is a short between two adjacent columns they will both light. To check shorts between unlit columns the one terminal of the power supply is connected to a different column conductive strip than that initially selected and the test is repeated. As with the first embodiment, the invention facilitates checking all columns without changing test connections.

The protocol for testing opens and for checking the white CIE colour coordinate and luminosity uniformity is to connect all three connecting strips for the columns 7,8, and 9 in parallel, and then proceed as per the protocol for the first embodiment of FIG. 2.

The protocol for independently checking the CIE colour coordinates and luminosity uniformity for red, green and blue sub-pixels in the embodiment of FIG. 3, is to connect one column connecting strip at a time and otherwise proceed as discussed above for white CIE colour coordinate and luminosity uniformity.

Figure 4:
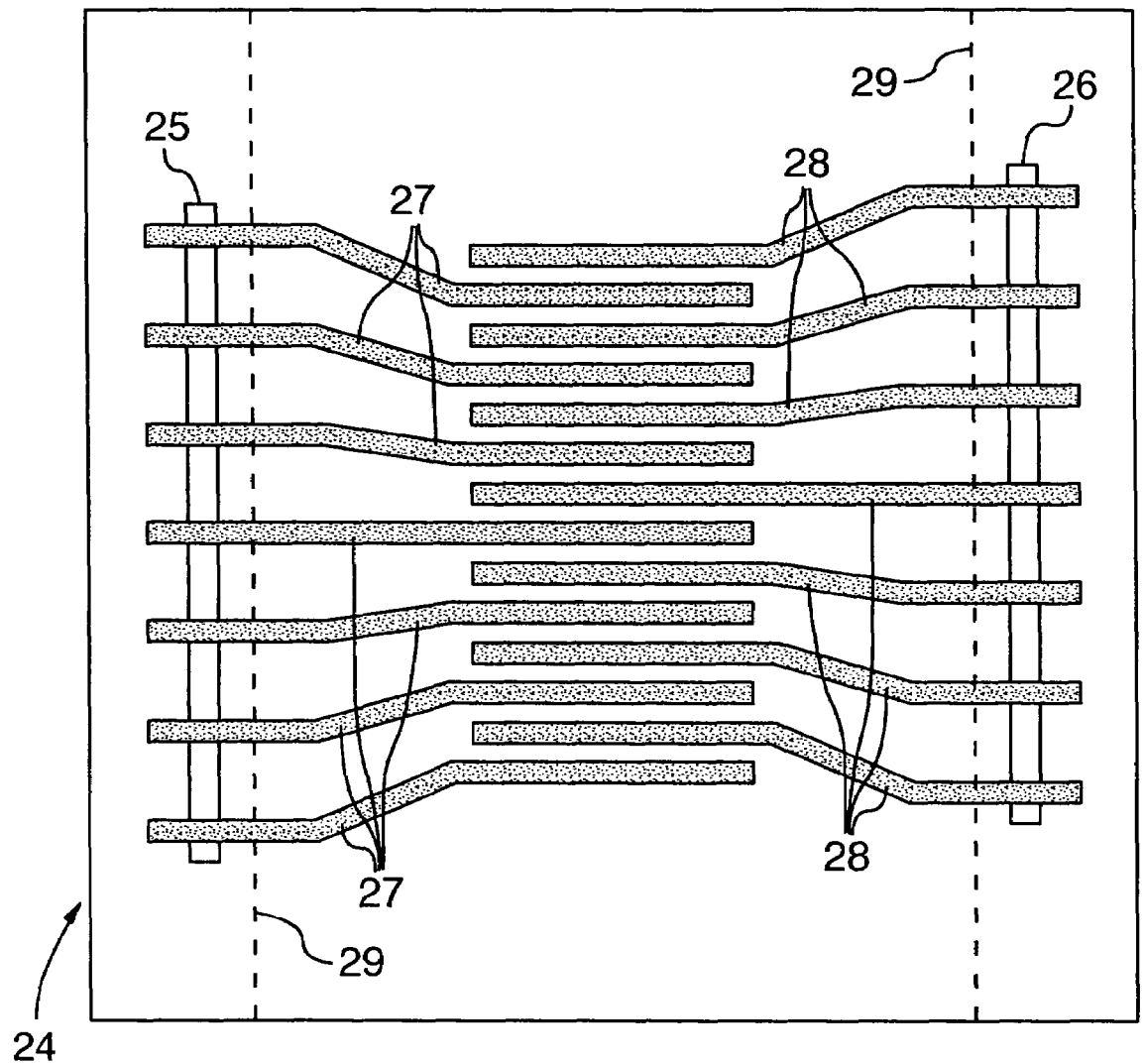
FIG. 4 shows a plan view of an ELD according to a second alternative embodiment of the invention.

A third embodiment, similar to the first embodiment, is shown in FIG. 4, for use where row and/or column electrode extensions 27 and 28 are made alternately at opposite sides of the display panel. FIG. 4 shows the column connection arrangement when extensions 27 and 28 for alternate columns are made on opposite sides of a display panel 24. For clarity the row electrodes are not shown. If this electrode contact arrangement is used, the insulating patches are not required, and the two connecting insulating strips 25 and 26 can be aligned substantially perpendicular to the first set of electrodes 27, and the second set of electrodes 28 on opposite sides of the display so that they independently connect to said first and second electrode sets. Following testing the electrodes are cut at the dotted lines 29 on opposite ends of the display to facilitate connection of the column drivers.

One method of fabricating the electrode design of the invention is to form the first (row) electrode array including the extension strips for the rows and the extension strips for the upper (column) electrode array on the bare substrate in a single printing step. Next, the insulating cover patches as shown in FIG. 2 or 3 can be formed using thick film crossover dielectric materials as known in the thick film hybrid microelectronics art or other appropriate dielectric materials and methods. Then, the connecting conductive strips can be applied as shown in FIG. 2 or 3 using thick film conductor materials, also as known in the thick film hybrid microelectronics art, or other appropriate materials and methods. Finally, the display structure and then the second (column) array of electrodes can be formed to overlap with the column electrode extensions as known in the art.

An alternate method is to print the connecting conductive strips as shown in FIG. 2 or 3 for both rows and columns at the same time as the first (row) array of electrodes without the row electrode extensions, then deposit the insulating patches as shown in FIG. 2 or 3, and then print the row and column extension strips as shown in FIG. 2 or 3. Finally, the display structure and second (column) array of electrodes can be formed as detailed above.

A person understanding the present invention may conceive of other embodiments or variations therein, without departing from the sphere and scope of the invention as set forth in the claims appended hereto.

What is claimed is:

1. An Electroluminescent Display (ELD) and testing apparatus combination comprising:
   a substrate,
   a matrix of pixels, arranged in rows and columns, formed on said substrate to define an active area of said ELD,
   at least first and second sets of electrode extensions, each electrode extension set comprising a plurality of electrode extensions, each electrode extension of said first set extending from a respective row of pixels of said matrix, and each electrode extension of said second set extending from a respective column of pixels of said matrix, wherein one of said first and second electrode extension sets comprises a first subset of electrode extensions of a first length and a second subset of electrode extensions of a second length, wherein the second length is shorter than the first length and wherein the electrode extensions of said first and second subsets are interleaved,
   a first connector, generally extending in a direction perpendicular to the electrode extensions of said first and second subsets, and in electrical contact with the electrode extensions of said second subset,
   a second connector, generally extending in a direction perpendicular to the electrode extensions of said first subset, and in electrical contact with the electrode extensions of only said first subset,
   and a set of insulating patches electrically separating said electrode extensions of said first subset from said first connector, wherein all said connectors are located beyond the periphery of said active area to define a scribing region along said electrode extensions between said periphery and said first connector thereby to enable said connectors and a portion of said electrode extensions to be removed from said ELD by scribing off said periphery or by scribing a gap in the electrode extensions to electrically isolate that portion of the electrode extensions connected to the rows and columns of said matrix from that portion of the electrode extensions in electrical contact with the connectors.

2. The ELD and testing apparatus combination of claim 1 wherein the other of said first and second electrode extension sets comprises a third subset of electrode extensions of a third length and a fourth subset of electrode extensions of a fourth length, wherein the fourth length is shorter than said third length and wherein the electrode extensions of said third and fourth subsets are interleaved, and wherein said ELD and testing apparatus combination further comprises a third connector, generally extending in a direction perpendicular to the electrode extensions of said third and fourth subsets, and in electrical contact with the electrode extensions of said fourth subset, a fourth connector, generally extending in a direction perpendicular to the electrode extensions of said third subset, and in electrical contact with the electrode extensions of only said third subset, and a second set of insulating patches electrically separating said electrode extensions of said third subset from said third connector.

3. The ELD and testing apparatus combination of claim 2 wherein the electrode extensions of said first set extend in a direction substantially orthogonal to the electrode extensions of said second set.

4. The ELD and testing apparatus combination of claim 3 wherein the portions of the electrode extensions connected to the rows and columns of said matrix that are isolated from the portions in electrical contact with the connectors are of sufficient length to enable connections of permanent drivers thereto.

5. The ELD and testing apparatus combination of claim 2 wherein the portions of the electrode extensions connected to the rows and columns of said matrix that are isolated from the portions in electrical contact with the connectors are of sufficient length to enable connections of permanent drivers thereto.

6. A method of fabricating the ELD and testing apparatus combination of claim 1 comprising the steps:
fabricating row and column electrodes of said matrix and said one of said first and second electrode extension sets on said substrate,
fabricating all said insulating patches by depositing a thick film dielectric, on to said substrate,
fabricating all said connectors by depositing a conductor on to said substrate, and fabricating said matrix of pixels and said other of said first and second electrode extension sets on said substrate.

7. A method of fabricating the ELD and testing apparatus combination of claim 1 comprising the steps:
fabricating row and column electrodes of said matrix and said other of said first and second electrode extension sets on said substrate,
fabricating all said insulating patches by depositing a thick film dielectric, on to said substrate,
fabricating all said connectors by depositing a conductor on to said substrate, and
fabricating said matrix of pixels and said one of said first and second electrode extension sets on said substrate.

8. A method of fabricating the ELD and testing apparatus combination of claim 1 comprising the steps:
fabricating all said connectors by depositing a conductor on to said substrate, and
fabricating said one of said first and second electrode extension sets on said substrate,
fabricating all said insulating patches by depositing a thick film dielectric, on to said substrate,
fabricating row and column electrodes of said matrix on to said substrate, and
fabricating said matrix of pixels and said other of said first and second electrode extension sets on said substrate.

9. A method of fabricating the ELD and testing apparatus combination of claim 1 comprising the steps:
fabricating all said connectors by depositing a conductor on to said substrate, and
fabricating the other of said first and second electrode extension sets on said substrate,
fabricating all said insulating patches by depositing a thick film dielectric, on to said substrate,
fabricating row and column electrodes of said matrix on to said substrate, and
fabricating said matrix of pixels and said one of said first and second electrode extension sets on said substrate.

10. An Electroluminescent Display (ELD) and testing apparatus combination comprising:
a substrate,
a matrix of pixels, arranged in rows and columns, formed on said substrate,
at least first and second sets of electrode extensions, each electrode extension set comprising a plurality of electrode extensions, each electrode extension of said first set extending from a respective row of pixels of said matrix, and each electrode extension of said second set extending from a respective column of pixels of said matrix, wherein one of said first and second electrode extension sets comprises a first subset of electrode extensions of a first length, a
second subset of electrode extensions of a second length shorter than said first length, and a third subset of electrode extensions of a third length shorter than the first and second lengths,
a first connector, generally extending in a direction perpendicular to the electrode extensions of said first, second and third subsets, and in electrical contact with the electrode extensions of said third subset,
a second connector, generally extending in a direction perpendicular to the electrode extensions of said first and second subsets, and in electrical contact with the electrode extensions of only said second subsets,
a third connector, generally extending in a direction perpendicular to the electrode extensions of said first subset, and in electrical contact with the electrode extensions of only said first subset,
a first set of insulating patches electrically separating said electrode extensions of said first and second subsets from said first connector,
and a second set of insulating patches electrically separating said electrode extensions of said first subset from said second connector.

11. The ELD and testing apparatus combination of claim 10 wherein the other of said first and second electrode extension sets comprises a fourth subset of electrode extensions of a fourth length, and a fifth subset of electrode extensions of a fifth length, wherein said fifth length is shorter than said fourth length and wherein the electrode extensions of said fourth and fifth subsets are interleaved, and wherein said ELD and testing apparatus combination further comprises a fourth connector, generally extending in a direction perpendicular to the electrode extensions of said fourth and fifth subsets, and in electrical contact with the electrode extensions of said fifth subset, a fifth connector, generally extending in a direction perpendicular to the electrode extensions of said fourth subset, and in electrical contact with the electrode extensions of only said fourth subset, and a third set of insulating patches electrically separating said electrode extensions of said fourth subset from said fourth connector.

12. The ELD and testing apparatus combination of claim 11 wherein the electrode extensions of said first set extend in a direction substantially orthogonal to the electrode extensions of said second set.

13. The ELD and testing apparatus combination of claim 10 wherein all said connectors are located beyond the substrate periphery such that said connectors and a portion of said electrode extensions may be removed by scribing off said substrate periphery or scribing a gap in the electrode extensions to electrically isolate that portion of the electrode extensions connected to the rows and columns of said matrix from that portion of the electrode extensions in electrical contact with the connectors.

14. The ELD and testing apparatus combination of claim 13 wherein the portions of the electrode extensions connected to the rows and columns of said matrix that are isolated from the portions in electrical contact with the connectors are of sufficient length to enable connections of permanent drivers thereto.

15. A method of fabricating the ELD and testing apparatus combination of claim 10 comprising the steps:
(i) fabricating row and column electrodes of said matrix and said one of said first and second electrode extension sets on said substrate,
(ii) fabricating all said insulating patches by depositing a thick film dielectric, on to said substrate,
(iii) fabricating all said connectors by depositing a conductor on to said substrate, and
(iv) fabricating said matrix of pixels and said other of said first and second electrode extension sets on said substrate.

16. A method of fabricating the ELD and testing apparatus combination of claim 10 comprising the steps:
(i) fabricating row and column electrodes of said matrix and said other of said first and second electrode extension sets on said substrate,
(ii) fabricating all said insulating patches by depositing a thick film dielectric, on to said substrate,
(iii) fabricating all said connectors by depositing a conductor on to said substrate, and
(iv) fabricating said matrix of pixels and said one of said first and second electrode extension sets on said substrate.

17. A method of fabricating the ELD and testing apparatus combination of claim 10 comprising the steps:
(i) fabricating all said connectors by depositing a conductor on to said substrate, and fabricating said one of said first and second electrode extension sets on said substrate,
(ii) fabricating all said insulating patches by depositing a thick film dielectric, on to said substrate,
(iii) fabricating row and column electrodes of said matrix on to said substrate, and
(iv) fabricating said matrix of pixels and said other of said first and second electrode extension sets on said substrate.

18. A method of fabricating the ELD and testing apparatus combination of claim 10 comprising the steps:
(i) fabricating all said connectors by depositing a conductor on to said substrate, and fabricating the other of said first and second electrode extension sets on said substrate,
(ii) fabricating all said insulating patches by depositing a thick film dielectric, on to said substrate,
(iii) fabricating row and column electrodes of said matrix on to said substrate, and
(iv) fabricating said matrix of pixels and said one of said first and second electrode extension sets on said substrate.

19. An Electroluminescent Display (ELD) and testing apparatus combination comprising:
a substrate,
a matrix of pixels, arranged in rows and columns, formed on said substrate to define an active area of said ELD,
at least first and second sets of electrode extensions, each electrode extension set comprising a plurality of electrode extensions, each electrode extension of said first set extending from a respective row of pixels of said matrix, and each electrode extension of said second set extending from a respective column of pixels of said matrix, wherein one of said first and second electrode extension sets comprises a first subset of electrode extensions, and a second subset of electrode extensions, wherein the electrode extensions of said first subset extend from one side of said matrix and wherein the electrode extensions of said second subset extend from an opposite side of said matrix, a first connector, generally extending in a direction perpendicular to, and in electrical contact with said first set of electrode extensions,
and a second connector, generally extending in a direction perpendicular to, and in electrical contact with said second set of electrode extensions, wherein all said connectors are located beyond the periphery of said active area to define a scribing region along said electrode extensions between said periphery and said first connector thereby to enable said connectors and a portion of said electrode extensions to be removed from said ELD by scribing off said periphery or by scribing a gap in the electrode extensions to electrically isolate that portion of the electrode extensions connected to the rows and columns from that portion of the electrode extensions in electrical contact with the connectors.

20. The ELD and testing apparatus combination of claim 19 wherein the other of said first and second electrode extension sets comprises a third subset of electrode extensions of a first length and a fourth subset electrode extensions of a second length, shorter than said first length,
and wherein said ELD and testing apparatus combination further comprises a third connector, generally extending in a direction perpendicular to the electrode extensions of said third and fourth subsets, and in electrical contact with the electrode extensions of said fourth subset,
a fourth connector, generally extending in a direction perpendicular to the electrode extensions of said third subset, and in electrical contact with the electrode extensions of only said third subset,
and a set of insulating patches electrically separating said electrode extensions of said third subset from said third connector.

21. The ELD and testing apparatus combination of claim 19 wherein the other of said first and second electrode extension sets comprises a third subset of electrode extensions of a first length, a fourth subset of electrode extensions of a second length shorter than said first length, and a fifth subset of electrode extensions of a third length shorter than the first and second lengths, a third connector, generally extending in a direction perpendicular to the electrode extensions of said third, fourth and fifth subsets, and in electrical contact with the electrode extensions of said fifth subset, a fourth connector, generally extending in a direction perpendicular to the electrode extensions of said third and said fourth subsets, and in electrical contact with the electrode extensions of only said fourth subset, a fifth connector, generally extending in a direction perpendicular to the electrode extensions of said third subset, and in electrical contact with the electrode extensions of only said third subset, a first set of insulating patches electrically separating said electrode extensions of said third and fourth subsets from said first connector, and a second set of insulating patches electrically separating said electrode extensions of said third subset from said second connector.

22. A method of fabricating the ELD and testing apparatus combination of claim 19 comprising the steps:
(i) fabricating row and column electrodes of said matrix and said one of said first and second electrode extension sets on said substrate,
(ii) fabricating all said insulating patches by depositing a thick film dielectric, on to said substrate,
(iii) fabricating all said connectors by depositing a conductor on to said substrate, and
(iv) fabricating said matrix of pixels and said other of said first and second electrode extension sets on said substrate.

23. A method of fabricating the ELD and testing apparatus combination of claim 19 comprising the steps:
(i) fabricating row and column electrodes of said matrix and said other of said first and second electrode extension sets on said substrate,
(ii) fabricating all said insulating patches by depositing a thick film dielectric, on to said substrate,
(iii) fabricating all said connectors by depositing a conductor on to said substrate, and
(iv) fabricating said matrix of pixels and said one of said first and second electrode extension sets on said substrate.

24. A method of fabricating the ELD and testing apparatus combination of claim 19 comprising the steps:
(i) fabricating all said connectors by depositing a conductor on to said substrate, and fabricating said one of said first and second electrode extension sets on said substrate,
(ii) fabricating all said insulating patches by depositing a thick film dielectric, on to said substrate,
(iii) fabricating row and column electrodes of said matrix on to said substrate, and
(iv) fabricating said matrix of pixels and said other of said first and second electrode extension sets on said substrate.

25. A method of fabricating the ELD and testing apparatus combination of claim 19 comprising the steps:
(i) fabricating all said connectors by depositing a conductor on to said substrate, and fabricating the other of said first and second electrode extension sets on said substrate,
(ii) fabricating all said insulating patches by depositing a thick film dielectric, on to said substrate,
(iii) fabricating row and column electrodes of said matrix on to said substrate, and
(iv) fabricating said matrix of pixels and said one of said first and second electrode extension sets on said substrate.

26. An Electroluminescent Display (ELD) and testing apparatus combination comprising:
a substrate,
a matrix of pixels, arranged in rows and columns, formed on said substrate to define an active area of said ELD,
at least first and second sets of electrode extensions, the first set of electrode extensions comprising a plurality of electrode extensions each of which extends from a respective row of pixels of said matrix, and the second set of electrode extensions comprising a plurality of electrode extensions each of which extends from a respective column of pixels of said matrix, wherein at least one of said first and second electrode extension sets comprises a first subset of electrode extensions of a first length, a second subset of electrode extensions of a second length shorter than said first length, and a third subset of electrode extensions of a third length shorter than the first and second lengths, a first connector, generally extending in a direction perpendicular to the electrode extensions of said first, second and third subsets, and in electrical contact with the electrode extensions of said third subset, a second connector, generally extending in a direction perpendicular to the electrode extensions of said first and said second subsets, and in electrical contact with the electrode extensions of only said second subsets, a third connector, generally extending in a direction perpendicular to the electrode extensions of said first subset, and in electrical contact with the electrode extensions of only said first subset, a first set of insulating patches electrically separating said electrode extensions of said first and second subsets from said first connector, and a second set of insulating patches electrically separating said electrode extensions of said first subset from said second connector, wherein all said connectors are located beyond the periphery of said active area to define a scribing region along said electrode extensions between said periphery and said first connector thereby to enable said connectors and a portion of said electrode extensions to be removed from said ELD by scribing off said periphery or by scribing a gap in the electrode extensions to electrically isolate that portion of the electrode extensions connected to the rows and columns of said matrix from that portion of the electrode extensions in electrical contact with the connectors.

27. The ELD and testing apparatus combination of claim 26 wherein the electrode extensions of said first set extend in a direction substantially orthogonal to the electrode extensions of said second set.

28. The ELD and testing apparatus combination of claim 27 wherein the portions of the electrode extensions connected to the rows and columns of said matrix that are isolated from the portions in electrical contact with the connectors are of sufficient length to enable connections of permanent drivers thereto.

29. The ELD and testing apparatus combination of claim 26 wherein the portions of the electrode extensions connected to the rows and columns of said matrix that are isolated from the portions in electrical contact with the connectors are of sufficient length to enable connections of permanent drivers thereto.

* * * * *